(12) United States Patent
Eiswerth et al.

(10) Patent No.: US 9,018,957 B2
(45) Date of Patent: Apr. 28, 2015

(54) METHOD AND SYSTEM FOR DIAGNOSTIC MEASUREMENT OF MOTOR VEHICLE RESTRAINT SYSTEM SQUIB LOOP RESISTANCE

(71) Applicant: Autoliv ASP, Inc., Ogden, UT (US)

(72) Inventors: David Eiswerth, Wixom, MI (US); Vincent Colarossi, Dearborn Heights, MI (US); Stuart Andrew Koch, West Bloomfield, MI (US)

(73) Assignee: Autoliv ASP, Inc., Ogden, UT (US)

( * ) Notice: Subject to any disclaimer, the term of this patent is extended or adjusted under 35 U.S.C. 154(b) by 297 days.

(21) Appl. No.: 13/688,895

(22) Filed: Nov. 29, 2012

(65) Prior Publication Data

US 2014/0145725 A1    May 29, 2014

(51) Int. Cl.
| | | |
|---|---|---|
| G01R 31/00 | (2006.01) | |
| G01R 31/08 | (2006.01) | |
| G01R 27/08 | (2006.01) | |
| B60R 21/017 | (2006.01) | |
| G01R 31/02 | (2006.01) | |

(52) U.S. Cl.
CPC .......... B60R 21/017 (2013.01); B60R 21/0173 (2013.01); G01R 31/025 (2013.01)

(58) Field of Classification Search
CPC   B60R 21/017; B60R 21/0173; G01R 31/021; G01R 31/024; G01R 31/025; G01R 31/2829; G01R 27/02; G01R 27/14; G01R 27/18; G01R 27/20; G01R 19/0092

USPC .......... 324/500, 502, 522, 523, 525, 527, 549, 324/600, 618, 649, 654, 691, 713; 702/1, 702/57, 64

See application file for complete search history.

(56) References Cited

U.S. PATENT DOCUMENTS

| | | | |
|---|---|---|---|
| 5,506,509 A | | 4/1996 | Susak |
| 6,012,736 A | * | 1/2000 | Hansen et al. ................ 280/735 |
| 6,211,682 B1 | * | 4/2001 | Liu ................................ 324/502 |
| 6,571,712 B2 | | 6/2003 | Lebaudy et al. |
| 6,597,181 B2 | * | 7/2003 | Boran et al. .................. 324/525 |
| 7,352,556 B2 | | 4/2008 | Miyake et al. |
| 7,418,330 B2 | | 8/2008 | Ooyabu |
| 7,819,004 B2 | | 10/2010 | Steele et al. |
| 7,872,478 B2 | * | 1/2011 | Saha et al. .................... 324/512 |
| 2006/0000948 A1 | | 1/2006 | Ooyabu |
| 2008/0086250 A1 | * | 4/2008 | Kuivenhoven ................. 701/45 |
| 2012/0221201 A1 | | 8/2012 | Aoki |
| 2012/0276761 A1 | | 11/2012 | Martin et al. |

FOREIGN PATENT DOCUMENTS

DE    10 2008 054 675 A1    6/2010

\* cited by examiner

*Primary Examiner* — Hoai-An D Nguyen
(74) *Attorney, Agent, or Firm* — Brinks Gilson & Lione

(57) ABSTRACT

A method of measuring squib loop resistance including non-linear elements in a restraint control module is disclosed by the present invention. The squib loop resistance is comprised of both linear and non-linear elements. The non-linear elements are linearized into resistive components about the bias points used to make the squib loop resistance measurement. The calculation of the linear squib loop resistance is provided by comparing the complete squib loop resistance and the linearized value of the non-linear elements.

23 Claims, 4 Drawing Sheets

METHOD AND SYSTEM FOR DIAGNOSTIC MEASUREMENT OF MOTOR VEHICLE RESTRAINT SYSTEM SQUIB LOOP RESISTANCE

FIELD OF THE INVENTION

The present invention relates generally to circuits used to measure resistance, and more particularly to a method and system for diagnostic measurement of squib loop resistance in a duplex of a motor vehicle airbag, occupant restraint system.

BACKGROUND OF THE INVENTION

Safety standards for modern automotive vehicles are becoming increasingly strict. The result of heightened standards and innovations by designers of vehicle resistant systems is twofold: 1) occupants of vehicles are safer and less likely to suffer serious injury in a collision, and 2) manufacturers are held to higher standards with little opportunity to offset costs. As a result of these trends, innovations that increase safety while retaining efficiency and low production costs are essential to manufacturers of related technology.

Airbag systems typically are composed of a restraint control module and a reaction canister. The reaction canister contains a folded airbag and an inflator with an igniter (squib). The inflator is connected to the restraint control module via conductive wires and associated connectors. The total electrical path of these wires and connectors to and from the inflator is termed the "squib loop." Airbag deployment is initiated when vehicle acceleration sensors measure a threshold sufficient to warrant deployment. Upon this event, a signal is sent to the restraint control module. The restraint control module then provides sufficient energy to the inflator through the squib loop to initiate the discharge of inflator gas to inflate and deploy the airbag.

The restraint control module controls the overall operation of the airbag system and essentially could be viewed as the main control unit for the airbag system. As with any system based on electronic components and sensors, airbag systems and their associated electronic components, require power from a power supply in order to function properly. Specifically, in airbag safety systems, customer demand and safety standards require that the integrity of operation be ensured through diagnostic verification of the airbag ignition system. A common method for diagnostic testing is completed by testing the squib loop for proper electrical resistance throughout vehicle operation.

Historically, airbag safety restraint systems typically employed a single inflator device to release inflation gas for inflating a vehicle occupant restraint airbag in the event of a collision. For these systems, the squib loop resistance is typically composed of linear resistive components including wire, connectors, clock-springs, EMI inductors, and the squib. Due to the constant resistance of these components they can be simplified by combining the individual element resistances into a total equivalent resistance. Since all of the components of a single inflator squib loop include only linear resistance components, the typical method employed for measuring squib loop resistance involves measurement of the differential squib loop voltage while providing specific bias current(s) and determining the squib loop resistance as a function of the voltage differential and the bias current. Such measurement is done at a current level significantly below the threshold to cause ignition of the squib. While this and other similar methods are effective for squib loops with only linear resistance, this analysis is inadequate to accurately determine the performance of more advanced systems.

In response to increasingly complex performance specifications, inflatable safety restraint technology has led to the development of what has been termed "adaptive" or "smart" inflator devices and corresponding inflatable restraint systems. Some examples of the present state of the art "smart" systems employ two stages (dual stage systems) for inflators that typically utilize two separate initiator assemblies. Common implementations of these systems utilize separate dedicated wires (firing lines) to conduct each safety device function signal. The signals are sent from a restraint control module to each airbag initiator being commanded to activate. Thus, the evolution of the technology to "smart" systems has led to an increase in the number of individual squib loops, connectors, output pins, and restraint control module connectors required for providing airbag activation. As a result, such dual stage systems are typically larger in packaging, size, heavier, and more complex in operation than their single stage counterparts.

In an effort to minimize the complexity in wiring and reduce wiring and connection cost, the dual stage systems have combined multiple squib loops into a single wiring squib loop path. This design approach is lighter and more efficient in design, but has also introduced some non-linear electrical components in the squib loop to provide for isolation of the individual squibs. In the single wiring squib loop design, the wire, connectors, clock-springs, EMI inductors, and squib are all comprised of resistively linear electrical components. Additional, non-linear components, added to isolate individual squibs, can be diodes (standard p-n junction diodes, Schottky diodes, etc.) bipolar junction transistors (BJT), insulated gate bipolar transistors (IGBT), MOSFETs, or other non-linear components. Unlike the common single stage designs, the linear and non-linear components cannot be combined into a simple, linear equivalent resistance. Other forms of advanced resistant systems implement multiple activated systems. For example, in addition to an airbag initiator squib, another system feature may be an airbag tether release, airbag vent, pretensioner or other system. Accordingly, dual stage resistant systems are an example of a duplex restraint system, on providing multiple commands which may be controlled on a single pair of conductors as described above.

The added complexity of duplex systems has rendered prior practices for squib loop resistance measurement insufficient. As stated previously, diagnostic testing is completed by testing the squib loop for proper resistance, but in non-linear systems, the resistance changes at varying bias currents. The result of the addition of non-linear components is a diminished the capability to complete accurate diagnostic testing and a limited capacity to provide the safety feedback sought after by vehicle manufacturers.

SUMMARY OF THE INVENTION

The present invention provides a system and method which addresses shortcomings of current solutions for conducting periodic diagnostic testing of squib loop resistances in multi-stage inflators and other duplex systems for motor vehicle occupant restraint systems. Current solutions are limited to trading efficient wiring methods for diminished diagnostic capability. The method and system disclosed allow for accurate diagnostic testing of the linear resistance components of airbag initiator devices that incorporate non-linear resistive electrical components in their circuitry. The benefits of the disclosed invention include decreased material and cost while maintaining reliable and accurate diagnostic measurement of linear squib loop resistance.

DETAILED DESCRIPTION OF THE DRAWINGS

DETAILED DESCRIPTION OF THE PRESENTLY PREFERRED EMBODIMENTS

Figure 1:
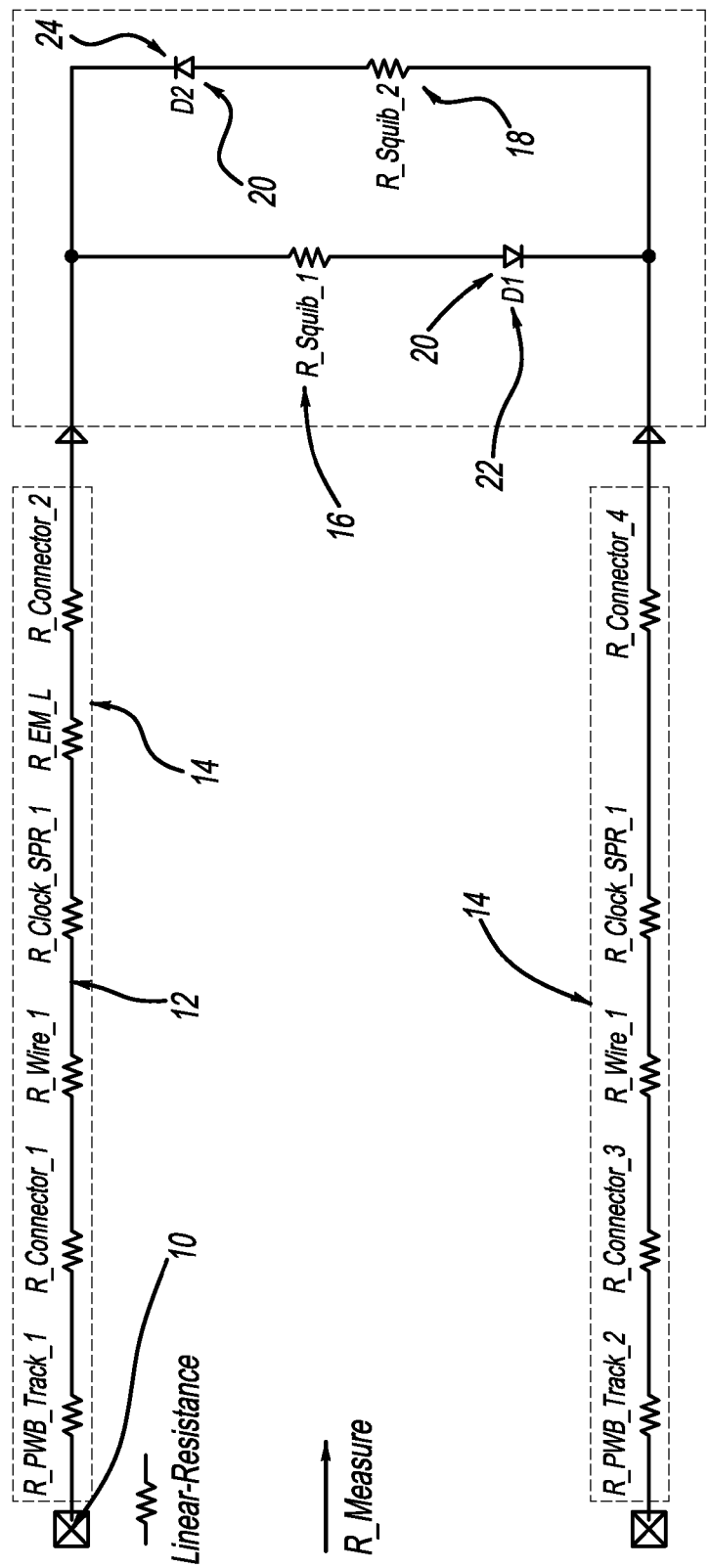
FIG. 1 depicts a circuit schematic demonstrating a preferred embodiment of a dual-stage inflator system for implementing a method for diagnostic measurement of squib loop resistance including non-linear components.

Referring to FIG. 1, a circuit schematic of a representative squib loop including non-linear components is illustrated. The control unit terminals 10 conduct a bias current through the conducting wire 12 and the linear resistance elements 14 of the squib loop. The linear resistance elements 14 include wire, connectors, clock-springs, EMI inductors and the individual squibs. Depending on the direction of the current bias, the current will flow through either the first squib 16 or the second squib 18. During diagnostic operation, the current is insufficient to initiate airbag inflation. The non-linear resistance elements 20 are illustrated here as the first diode 22 and second diode 24. The benefit of the diode placement in the design is more clearly represented by a simplified circuit schematic.

Figure 2:
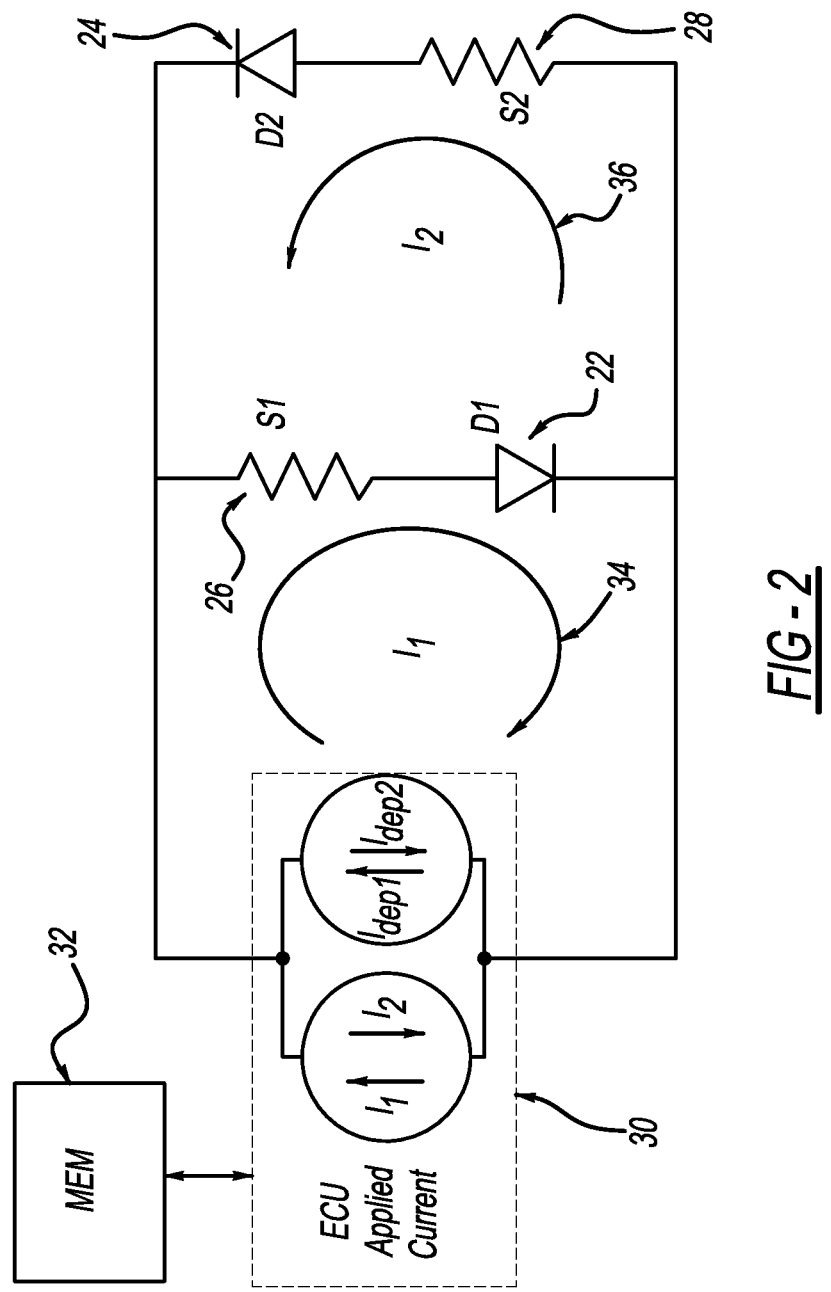
FIG. 2 depicts a simplified circuit schematic with linear and non-linear resistances combined and demonstrating the control module and memory.

FIG. 2 represents a simplified circuit schematic with the individual linear resistance elements 14 combined into a first equivalent linear resistance 26, and a second equivalent linear resistance 28 corresponding to each squib loop. The equivalent resistances 26 and 28 include the linear resistance elements and separate squibs 16 and 18. The schematic further illustrates the control module 30 which may use memory 32 to store the system information used to perform the calculations, and commands that follow. The control module 30 serves to activate current for both diagnostic testing and airbag activation (for example) in the first current path, defining the first squib loop 34 and second current path, defining the second squib loop 36 through the control module terminals 10. The symbols and directions denoted in the control module 30 demonstrate diagnostic signals, $I_1$ and $I_2$, as well has the deployment signals, $I_{dep_1}$ and $I_{dep_2}$. The first diode 22 and second diode 24 operate to restrict current from flowing through the second squib loop 36 and first squib loop 34 respectively to ensure first squib 16 and second squib 18 can be tested or fired independently.

Figure 3:
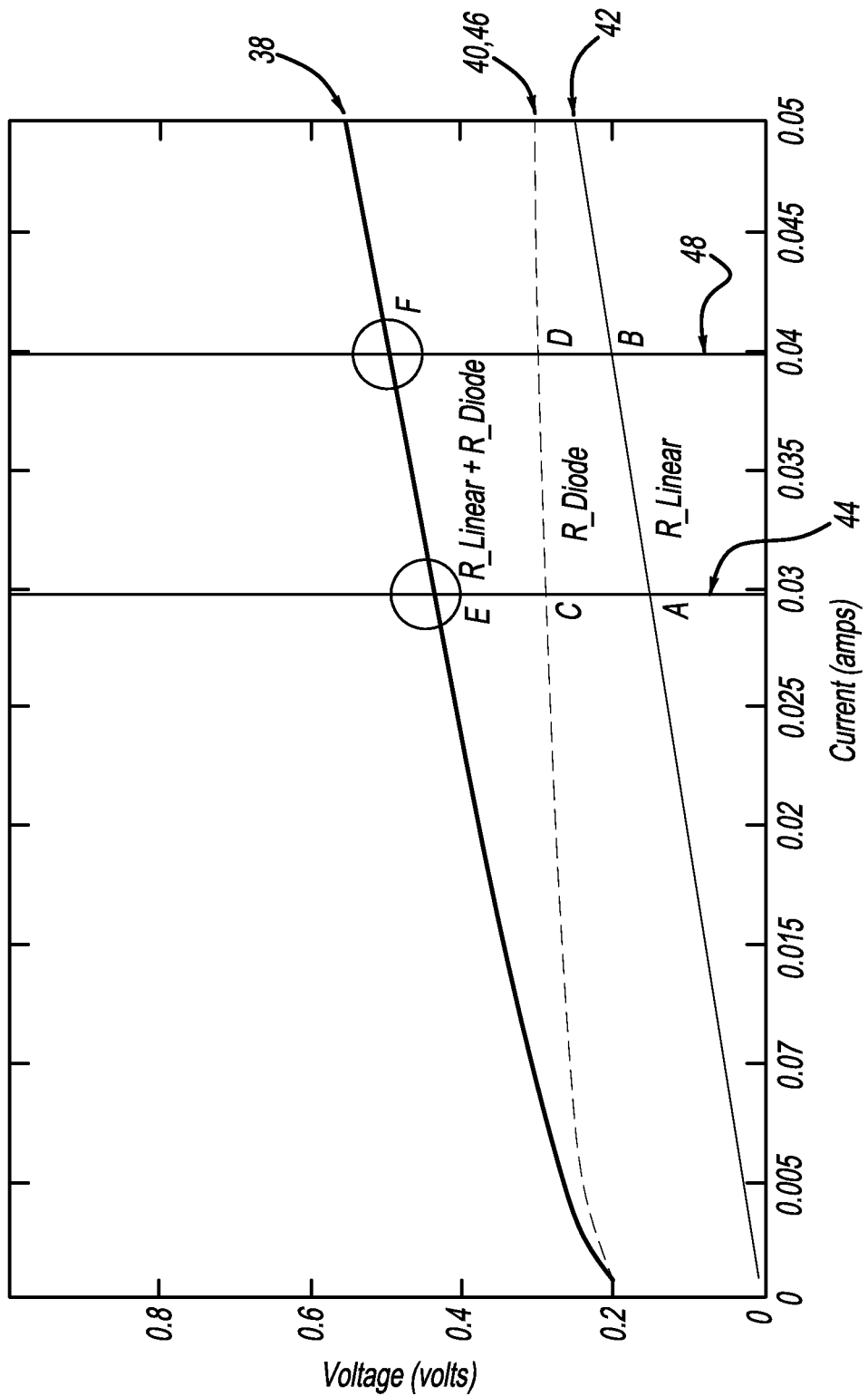
FIG. 3 illustrates a graphical depiction of the total squib loop resistance, linear resistance and non-linear resistance over a range of bias currents.

Referring to FIG. 3, the measured voltage (vertical axis) is illustrated for the curves defined by the total squib loop resistance 38, non-linear resistance 40, and linear resistance 42 for a representative squib loop. The voltage curves are representative for one of the dual stage initiator squib loops over a range of bias current (horizontal axis). At a first bias current $I_1$ the total squib loop resistance 38, $R_{total}$, is related to the non-linear resistance 40, $R_{diode}$, and the linear resistance 42, $R_{linear}$. The respective first total differential voltage $V_E$ (Point E) is related similarly to the first differential voltage $V_C$ (Point C) for non-linear elements and the first linear differential voltage $V_A$ (Point A) for linear elements. The general relationships of the relevant properties are related by the following equations:

$$V_E = V_C + V_A$$
$$\frac{V_E}{I_1} = \frac{V_C}{I_1} + \frac{V_A}{I_1} \rightarrow R_{total} = R_{diode} + R_{linear}$$

In one embodiment, a single current bias measurement is applied to calculate the approximate linear resistance 42 of a reference squib loop. The squib loop has a known or defined linear resistance 42. In this method, the diode resistance 40 is linearized as the proportion of a first bias current $I_1$ and the resulting first differential voltage $V_C$ (Point C) measured across a non-linear resistance component 20 (representing the first diode 22 or second diode 24 depending on current direction). The resulting first differential voltage $V_C$ (Point C) of the non-linear resistance 40 and the first bias current $I_1$ are used to calculate the approximate diode resistance 46, $R_{diode}$, at the first bias current $I_1$ as follows:

$$R_{diode} = R_{total} - R_{linear}$$

Now referring to FIGS. 2 and 3, the diode resistance 46 at the first bias current $I_1$ measured from the reference squib loop is stored in memory 32. In practice, the diode resistance 46 may also be characterized in manufacture and the nominal diode resistance 46 may be stored in memory 32. During vehicle operation, the control module 30 iteratively calculates the total squib loop resistance 38 as follows. The total squib loop resistance 38 at the first bias current $I_1$ is measured when the control module 30 generates the first bias current $I_1$ and measures the first total differential voltage $V_E$ (Point E). The total squib loop resistance 38 is then calculated as follows with the total squib loop resistance 38 denoted as $R_{total}$. Where:

$$R_{total} = \frac{V_E}{I_1}$$

With the total squib loop resistance 38 calculated and the diode resistance 46 stored in memory 32, the linear resistance 42 can be determined as the difference in resistance, where:

$$R_{linear} = R_{total} - R_{diode}$$

After substitution, the linear resistance 42 is expressed as follows:

$$R_{linear} = \frac{V_E}{I_1} - R_{diode} = \frac{V_E}{I_1} - \frac{V_C}{I_1}$$

Further substitution of the first linear differential voltage $V_A$ (Point A), yields the following:

$$R_{linear} = \frac{V_E - V_C}{I_1} = \frac{V_A}{I_1}$$

From the described method, the operation of the system allows for improved accuracy in diagnostic measurement of the linear resistance 42 from the total squib loop resistance 38 including both non-linear and linear components.

With the linear resistance 42 calculated, the control module 30 compares the measured linear resistance 42 with the nominal linear resistance for the each squib loop (16 or 18) stored in memory 32. This comparison is repeated during vehicle operation to determine if the first squib loop 16 or second squib loop 18 have a linear resistance 42 within an acceptable range also stored in the memory 32. It should be noted that the first bias current $I_1$ used to linearize the nonlinear components does not have to be the same magnitude as the first bias current $I_1$ used it during the process of diagnostic measurement for example on an associated motor vehicle.

Still referring to FIGS. 2 and 3, in another embodiment, a dual current bias measurement is applied to reduce error in diagnostic measurements during vehicle operation. In this method, the diode resistance 46 is calculated at a first bias current $I_1$ and second bias current $I_2$. In this example, the diode resistance 46 is calculated from measurements of a first differential voltage $V_C$ (Point C) and second differential voltage $V_D$ (Point D) at the first bias current $I_1$ and second bias current $I_2$ respectively:

$$R_{diode} = \frac{V_C - V_D}{I_1 - I_2}$$

The diode resistance 46 is then stored into memory similar to the previously described embodiment.

Figure 4:
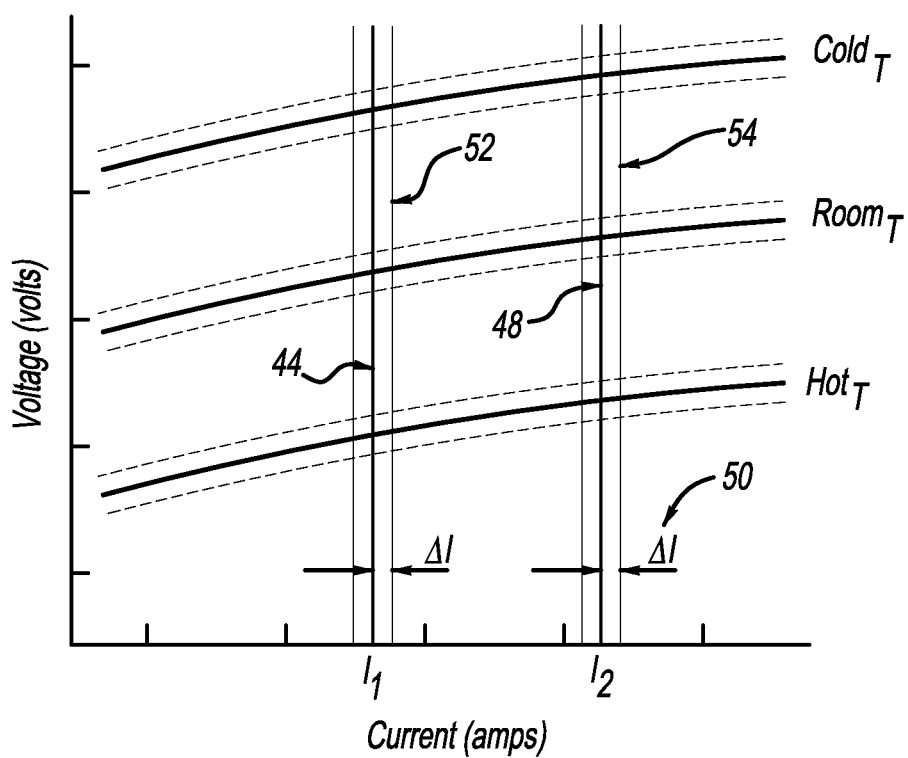
FIG. 4 is a graphical depiction of the measured voltage and associated for a diode at various operating temperatures.

Referring to FIG. 4 and the following calculations, the benefits of the dual current bias current method are apparent. FIG. 4 demonstrates the measured voltage (vertical axis) of a non-linear resistance 40 element over a range of bias current at various operating temperatures. FIG. 4 also emphasizes the error associated with the diagnostic measurements to further demonstrate the benefits of the disclosed method. During vehicle operation the control module 30 cannot apply the first bias current $I_1$ and second bias current $I_2$ exactly; however, the difference between the first bias current $I_1$ and the second bias $I_2$ current may be controlled more accurately. By approximating the average diode resistance 46 over a range between the first bias current $I_1$ and second bias current $I_2$, the measurement and calculation accuracy is improved.

Still referring to FIG. 4, an example of the variation in bias current application is illustrated by the differences in bias current $\Delta I_1$ and $\Delta I_2$ with respect to the first bias current $I_1$ and second bias current $I_2$. The variation in current applied by the control module 30 tends to shift uniformly for the first current bias $I_1$ and the second current bias $I_2$ during vehicle diagnostic operation. Applying the previously introduced equation for the diode resistance 46, the diagnostic measurement is significantly improved as shown in the following analysis:

$$R_{diode} = \frac{V_C - V_D}{(I_1 + \Delta I_1) - (I_2 + \Delta I_2)} = \frac{V_C - V_D}{(I_1 - I_2) + (\Delta I_1 - \Delta I_2)}$$

$\Delta I_1 \approx \Delta I_2$ (uniform bias current shift)

$$R_{diode} = \frac{V_C - V_D}{(I_1 - I_2)}$$

Applying this method has the benefit of significantly reducing the error in calculating the squib loop resistance by effectively eliminating any uniform bias current shifts from the diode resistance 46 calculation. In practice, the diode resistance 46 may also be characterized in manufacture and the nominal diode resistance 46 may be stored in memory 32.

Referring back to FIGS. 2 and 3, an improved approximation of the total squib loop resistance 38 is also achieved by applying the dual bias current method by diminishing the error in the applied bias currents. The total squib loop resistance is approximated from the first total differential voltage $V_E$ (Point E) at a first bias current $I_1$, and a second total differential voltage $V_F$ (Point F) at a second bias current $I_2$ by applying a similar method. Where:

$$R_{squib\ total} = \frac{V_E - V_F}{(I_1 - I_2)}$$

Applying the total squib loop 38 resistance with the diode resistance 46, stored in memory, the linear resistance 42 is calculated as follows:

$$R_{linear} = R_{squib\ total} - R_{diode}$$

After substitution, the linear resistance 42 is expressed as follows:

$$R_{linear} = \frac{V_E - V_F}{I_1 - I_2} - \frac{V_C - V_D}{I_1 - I_2} = \frac{(V_E - V_C) - (V_F - V_D)}{I_1 - I_2}$$

Further substitution of the first linear differential voltage (Point A), $V_A$, and the second linear differential voltage (Point B), $V_B$, yields the following.

$$R_{linear} = \frac{V_A - V_B}{I_1 - I_2}$$

Similar to the previously introduced method the linear resistance 42 is calculated and compared by the control module 30 to determine if the first squib loop 16 or second squib loop 18 have a linear resistance 42 within an acceptable range also configured in the memory 32. The methods and systems of this invention enable the use of industry required diagnostic testing of duplex resistant systems on vehicles. Measuring squib resistance is a necessary requirement, and these techniques are required in advanced systems having non-linear electrical elements.

While the present invention has been described with reference to specific exemplary embodiments, it will be evident that various modifications and changes may be made to these embodiments without departing from the broader scope of the invention as set forth in the claims. Accordingly, the specification and drawings are to be regarded in an illustrative rather than a restrictive sense.

What is claimed is:

1. A method of diagnostic measurement of a squib loop in a motor vehicle including at least one linear element and at least one non-linear element, comprising the steps of:

storing a resistance of the non-linear element into a memory;

applying a bias current through the squib loop including the linear element and the non-linear element;

measuring the voltage across the squib loop including the linear element and the non-linear element;

calculating the resistance of the squib loop including the linear element and the non-linear element at the bias current and measuring voltage across the squib loop; and calculating the squib loop resistance without the non-linear element by comparing the resistance of the squib loop including the linear element and the non-linear element with the resistance of the non-linear element from the memory.

2. The method of claim 1 wherein the resistance of the non-linear element is characterized by calculating the average resistance of the non-linear element prior to connection into the squib loop.

3. The method of claim 1 wherein the steps of claim 1 comprise one diagnostic measurement cycle and the diagnostic measurement cycle is repeated.

4. The method of claim 3 wherein the diagnostic measurement cycle is repeated at a time interval.

5. The method of claim 3 wherein the bias current through the squib loop varies in magnitude in different diagnostic measurement cycles.

6. The method of claim 1 wherein the squib loop resistance without the non-linear element is compared to a range stored in memory to verify squib loop integrity.

7. The method of claim 1 wherein the linear element is one or more linear resistive electronic elements.

8. The method of claim 1 wherein the non-linear element is one or more non-linear elements.

9. The method of claim 1 wherein the non-linear element is one or more of a diode, a p-n junction, a Schottky diode, a bipolar junction transistors (BJT), an insulated gate bipolar transistors (IGBT), or a MOSFET.

10. The method of claim 1 further comprising applying a second bias current and measuring a second voltage through the squib loop including the linear element and the non-linear element to calculate an average squib loop resistance with the calculated resistance of the squib loop and comparing the average squib loop resistance with the resistance of the non-linear element from the memory to determine the squib loop resistance without the non-linear element.

11. The method of claim 1 further comprising applying a second bias current and measuring a second voltage through the squib loop including the linear element and the non-linear element, measuring a second voltage across the squib loop including the linear element and the non-linear element, and calculating the a resistance of the squib loop including the linear element and the non-linear element as the proportion of the difference between the first and second squib loop voltages, and the difference between the first and second bias currents.

12. A method of diagnostic measurement of a squib loop in a motor vehicle including a linear element and a non-linear element, comprising the steps of:
    storing a resistance of the non-linear element into a memory;
    applying a first bias current across the squib loop including the linear element and the non-linear element;
    measuring a first squib loop voltage across the squib loop including the linear element and the non-linear element due to the first bias current;
    applying a second bias current across the squib loop including the linear element and the non-linear element;
    measuring a second squib loop voltage across the squib loop including the linear element and the non-linear element due to the second bias current;
    calculating the resistance of the squib loop including the linear element and the non-linear element as the proportion of the difference between the first and second squib loop voltages, and the difference between the first and second bias currents; and
    calculating the squib loop resistance without the non-linear element by comparing the resistance of the squib loop including the linear element and the non-linear element with the resistance of the non-linear element from the memory.

13. The method of claim 12 wherein the steps of claim 10 comprise one diagnostic measurement cycle and the diagnostic measurement cycle is repeated at an interval.

14. The method of claim 13 wherein the first bias current and second bias current vary in different diagnostic measurement cycles.

15. The method of claim 12 wherein the squib loop resistance without the non-linear element is compared to a range stored in memory to verify squib loop integrity.

16. The method of claim 12 wherein the linear element is one or more linear resistive electronic elements.

17. The method of claim 12 wherein the non-linear element is one or more non-linear elements.

18. The method of claim 12 wherein the non-linear element is one or more of a diode, a p-n junction diode, a Schottky diode, a bipolar junction transistors, an insulated gate bipolar transistors (IGBT), or a MOSFET.

19. A system for diagnostic measurement of resistance of a squib loop of a vehicle inflator system, the system comprising:
    a controller having a plurality of signal inputs and outputs;
    the controller being configured to store and receive information from a memory;
    a circuit loop having at least one squib loop;
    the squib loop having at least one linear and at least one non-linear resistive element;
    the controller having a pair of input/output terminals configured to apply current in a first direction across the pair of input/output terminals to measure a first resistance of a first squib loop and subsequently apply current in a second reverse direction to measure a second resistance of a second squib loop; and
    the controller configured to calculate a linear resistance without the non-linear resistive element by storing a resistance of the non-linear element in the memory and comparing the resistance of the non-linear element to a measured squib loop resistance.

20. The system of claim 19 wherein the controller is configured to calculate a linear resistance after current is applied in the first direction and after the current is applied in the second reverse direction.

21. The system of claim 19 wherein the linear element is one or more linear resistive electronic elements.

22. The system of claim 19 wherein the non-linear element is one or more non-linear elements.

23. The system of claim 19 wherein the non-linear element is one or more of a diode, a p-n junction diode, a Schottky diode, a bipolar junction transistor, an insulated gate bipolar transistors (IGBT), or a MOSFET.

* * * * *